United States Patent [19]

Heimer

[11] Patent Number: 4,521,743

[45] Date of Patent: Jun. 4, 1985

[54] SWITCHED CAPACITOR AMPLIFIER

[75] Inventor: Malcolm L. Heimer, Miami, Fla.

[73] Assignee: Cordis Corporation, Miami, Fla.

[21] Appl. No.: 566,701

[22] Filed: Dec. 29, 1983

[51] Int. Cl.³ .............................................. H03F 3/04
[52] U.S. Cl. ......................................... 330/296; 330/9
[58] Field of Search .................... 330/107, 109, 296, 9

[56] References Cited

U.S. PATENT DOCUMENTS 4,329,599 5/1982 Gregorian et al. ................. 330/107

Primary Examiner—James B. Mollins
Assistant Examiner—G. Wan
Attorney, Agent, or Firm—George H. Gerstman

[57] ABSTRACT

A switched capacitor amplifier includes an operational amplifier with an inverting input terminal, a non-inverting input terminal, a bias current input terminal, and an output terminal. Current generating means responsive to a pulse train is utilized to provide the high bias current only at the beginning of each pulse cycle to the bias current input terminal of the operational amplifier.

13 Claims, 2 Drawing Figures

SWITCHED CAPACITOR AMPLIFIER

BACKGROUND OF THE INVENTION

This invention relates generally to switched capacitor circuits and more particularly, it relates to a switched capacitor amplifier having a significantly reduced current in the switched capacitor stages. The invention has particular applications in band-pass filters, telecommunication equipment, speech synthesis circuits, analog-to-digital converters, and digital-to-analog converters.

In general, switched capacitor circuits have been preferred since capacitance circuits could be formed on the same integrated semiconductor chip having other circuit elements. In contrast, resistive network circuits are typically required to be external to the chip such as by being plated on a hybrid integrated circuit or by having resistors physically attached to printed circuit boards. This procedure is much more costly and time-consuming. However, by utilizing switched capacitor circuits having an operational amplifier there was suffered the disadvantage in that a high bias current on the operational amplifier was required. It would, therefore, be desirable to provide a switched capacitor circuit wherein the operational amplifier is operated in a more efficient and effective manner.

Although prior art operational amplifiers are typically current biased at a constant high level, I have found that the operational amplifier only needs the high current bias at the beginning of each cycle of operation and thereafter it can use much less bias current. To this end, the present invention provides a switched capacitor amplifier wherein the operational amplifier is supplied with a high bias current only at the beginning of each pulse cycle when a high slew rate is required and thereafter is current biased at a relatively low constant level so as to reduce current consumption.

SUMMARY OF THE INVENTION

It is a general object of the present invention to provide a switched capacitor amplifier circuit having a significantly reduced current in the switched capacitor stages.

Another object of the present invention is to provide a switched capacitor amplifier wherein a high bias current is provided only at the beginning of each pulse cycle.

It is still another object of the present invention to provide a switched capacitor amplifier wherein current generating means is provided to supply a high bias current only at the beginning of each pulse cycle to a bias current input of an operational amplifier.

In accordance with these aims and objectives of the present invention in the illustrative embodiment, there is provided a switched capacitor amplifier for generating a high initial current bias which includes an operational amplifier having an inverting input terminal, a non-inverting input terminal, a bias current input terminal, and an output terminal. A first capacitor has its one end connected to the inverting input terminal of the operational amplifier. Switching input means is connected to the other end of the first capacitor. A second capacitor is coupled between the inverting input terminal and the output terminal of the operational amplifier. Clock pulse means is coupled in parallel with the second capacitor. Current generating means responsive to the clock pulse means is provided to produce a high bias current only at the beginning of each pulse cycle to the bias current input terminal of the operational amplifier.

BRIEF DESCRIPTION OF THE DRAWINGS

These and other objects of the present invention will become more fully apparent from the following detailed description when read in conjunction with the accompanying drawings, wherein.

DESCRIPTION OF THE PREFERRED EMBODIMENT

Figure 1:
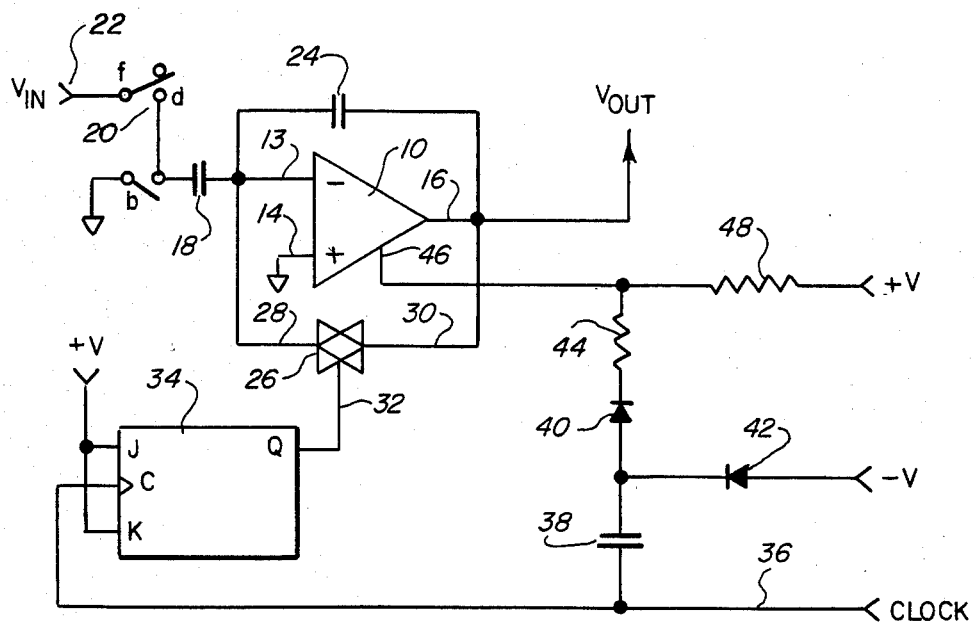
FIG. 1 is a schematic circuit diagram of a switched capacitor amplifier according to the present invention.

Referring now in detail to FIG. 1 of the drawings, there is illustrated a schematic circuit diagram of the switched capacitor amplifier constructed in accordance with the principles of the present invention. The switched capacitor amplifier comprises an operational amplifier 10 which has an inverting input terminal 12, a non-inverting input terminal 14, and an output terminal 16. The operational amplifier 10 is preferably formed by a pair of complementary coupled P-channel and N-channel metal-oxide-semiconductor field-effect transistors (not-shown) on an integrated semiconductor chip wherein the gate electrodes of the field-effect transistors are commonly connected to form the inverting input terminal 12 and the drain electrodes of the field-effect transistors are commonly connected to form the output terminal 16.

An input capacitor 18 has its one end connected to the input terminal 12 of the operational amplifier 10. The other end of the input capacitor 18 is connected to a normally-closed contact a and a normally-opened contact d of a double-pole - double-throw switch 20. The common contact b is tied to ground, and the common contact f is tied to a voltage input terminal 22. A feedback capacitor 24 is coupled between the inverting input terminal 12 and the output terminal 16 of the operational amplifier. A transmission gate 26 is also provided with its output leads 28, 30 being connected in parallel with the capacitor 24. The input terminal 32 of the transmission gate 26 is fed from the Q output of a J-K flip-flop 34. The J and K input terminals are commonly tied together and to a positive supply voltage +V. The input C of the flip-flop 34 is fed from a terminal 36 which receives a pulse train signal.

The pulse signal on the terminal 36 is tied to one end of a differentiating capacitor 38. The other end of the capacitor 38 is joined to the anode of a diode 40 and the cathode of diode 42. The anode of the diode 42 is connected to a negative supply voltage −V. The cathode of the diode 40 is coupled to one end of a resistor 44. The other end of the resistor 44 is fed to a bias input terminal 46 of the operational amplifier 10 and is tied to one end of a resistor 48. The other end of the resistor 48 is coupled to the positive supply voltage +V.

Figure 2:
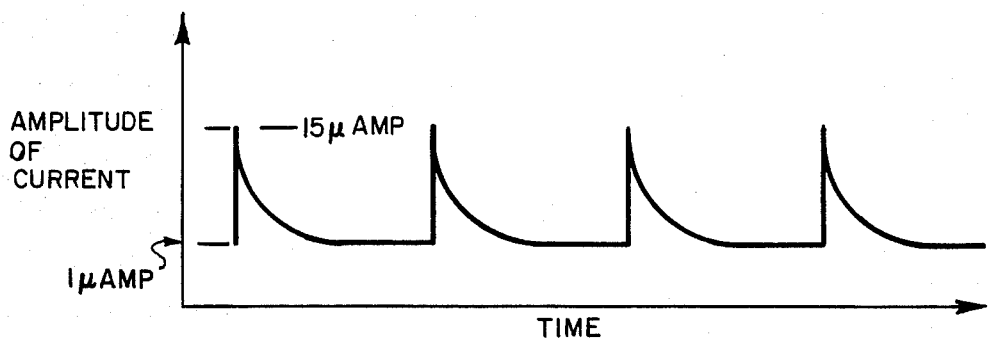
FIG. 2 is a time graph showing the spikes of a bias current applied to the operational amplifier.

The amplifier circuit operates as follows. The resistor 48 is used to supply a constant low level of current bias to the terminal 46. As a pulse train is supplied to the clock input terminal 36 and the clock terminal C of the flip-flop 34, the leading edges of each pulse will cause a series of spikes to appear at the current bias input terminal 46 since the differentiating capacitor 38 appears to be a short initially. As the capacitor 38 charges up, it will act as an open circuit. This causes the spikes to decay exponentially with a time constant determined by the resistor 44 and the capacitor 38. Thereafter, the bias current will be at the constant low level again until the leading edge of the next pulse. A typical wave form of the current appearing at the bias input terminal 46 of the operational amplifier 10 is illustrated in FIG. 2 of the drawings. The diode 40 will prevent the negative spikes on the trailing edges of the pulse train from reaching the bias input terminal 46. Thus, only the positive spikes which will increase the bias current are allowed through, and the negative spikes which would decrease the bias current are clipped.

As can thus be seen, the high bias current provided by the spikes are timed so that they appear on the leading edge of each clock pulse. This permits the operational amplifier 10 to have a high slew rate only when it is required to, and then it will return to a constant low current bias thereby reducing current consumption.

For completeness in the disclosure of the abovedescribed switched capacitor amplifier but not for the purposes of limitation, the following exemplary table of resistor and capacitor values shown in FIG. 1 is submitted:

| Resistors | Value in Ohms |
|---|---|
| 44 | 1 meg. |
| 48 | 20 meg. |
| Capacitors | Value in Picofarads |
| 18 | 24 |
| 24 | 24 |
| 38 | 100 |

With the above component values used, the peak bias current at the beginning of each pulse cycle was approximately 15 µamp. The constant low current bias was approximately 1 µamp. This has been shown in the graph of FIG. 2.

From the foregoing detailed description, it can thus be seen that the present invention provides a new and improved switched capacitor amplifier which includes an operational amplifier that is supplied with a high bias current only at the beginning of each pulse cycle and thereafter is current biased at a relatively low constant current level so as to reduce current consumption. A current generating means is responsive to a pulse train so as to provide such high biasing current.

While there has been described and illustrated what is at present to be a preferred embodiment of the present invention, it will be understood by those skilled in the art that various changes and modifications may be made, and equivalents may be substituted for elements thereof without departing from the true scope of the invention. In addition, many modifications may be made to adapt a particular situational material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A switched capacitor amplifier comprising:
an operational amplifier having an inverting input terminal, a non-inverting input terminal, a bias current input terminal, and an output terminal;
a capacitor coupled to said inverting input terminal of said operational amplifier;
timing means coupled to said operational amplifier for providing a plurality of timing cycles;
current generating means responsive to said timing means for providing a high bias current only at the beginning of each timing cycle to the bias input terminal of said operational amplifier.

2. A switched capacitor amplifier comprising:
an operational amplifier having an inverting input terminal, a non-inverting input terminal, a bias current input terminal, and an output terminal;
a first capacitor coupled to said inverting input terminal of said operational amplifier;
a second capacitor coupled between the inverting input terminal and the output terminal of said operational amplifier;
timing means coupled to said second capacitor for providing a plurality of timing cycles;
current generating means responsive to said timing means for providing a high bias current only at the beginning of each timing cycle to the bias input terminal of said operational amplifier.

3. A switched capacitor amplifier as claimed in claim 2, wherein said timing means comprises a transmission gate and a J-K flip-flop.

4. A switched capacitor amplifier as claimed in claim 3, wherein the Q output of said J-K flip-flop is coupled to the input terminal of said transmission gate.

5. A switched capacitor amplifier as claimed in claim 2, wherein said current generating means comprises a third capacitor, a diode, and a resistor.

6. A switched capacitor amplifier as claimed in claim 5, wherein a second resistor is connected to a positive supply voltage for supplying a constant low level bias current to said operational amplifier.

7. A switched capacitor amplifier comprising:
an operational amplifier having an inverting input terminal, a non-inverting input terminal, a bias current input terminal, and an output terminal;
a first capacitor having one end connected to said inverting input terminal of said operational amplifier;
switching input means connected to the other end of said first capacitor;
a second capacitor coupled between the inverting input terminal and the output terminal of said operational amplifier;
clock pulse means coupled in parallel to said second capacitor;
current generating means responsive to said clock pulse means for providing a high bias current only at the beginning of each pulse cycle to the bias input terminal of said operational amplifier.

8. A switched capacitor amplifier as claimed in claim 7, wherein said clock pulse means comprises a transmission gate and a J-K flip-flop.

9. A switched capacitor amplifier as claimed in claim 8, wherein the Q output of said J-K flip-flip is coupled to the input terminal of said transmission gate.

10. A switched capacitor amplifier as claimed in claim 7, wherein said current generating means comprises a third capacitor, a diode, and a resistor.

11. A switched capacitor amplifier as claimed in claim 7, wherein said switching input means comprises a double-pole - double-throw switch for switching an input voltage input terminal between a positive supply voltage and ground.

12. A switched capacitor amplifier as claimed in claim 10, wherein a second resistor is connected to a positive supply voltage for supplying a constant low level bias current to said operational amplifier.

13. A switched capacitor amplifier as claimed in claim 7, wherein said operational amplifier is formed by a pair of complementary coupled P-channel and N-channel MOSFETS.

* * * * *